(12) United States Patent
Asada

(10) Patent No.: US 7,896,543 B2
(45) Date of Patent: Mar. 1, 2011

(54) BATTERY CONDITION DETECTION APPARATUS

(75) Inventor: Tadatoshi Asada, Anjo (JP)

(73) Assignee: Denso Corporation, Kariya (JP)

(*) Notice: Subject to any disclaimer, the term of this patent is extended or adjusted under 35 U.S.C. 154(b) by 423 days.

(21) Appl. No.: 12/068,182

(22) Filed: Feb. 4, 2008

(65) Prior Publication Data
US 2008/0192800 A1    Aug. 14, 2008

(30) Foreign Application Priority Data
Feb. 8, 2007 (JP) ............................ 2007-028949

(51) Int. Cl.
G01N 25/00 (2006.01)
G01K 1/14 (2006.01)
H01M 2/18 (2006.01)

(52) U.S. Cl. ..................... 374/141; 374/208; 374/4; 374/57; 374/152; 320/150

(58) Field of Classification Search ............... 374/100, 374/153, 141, 43–45, 208, 4, 5, 178, 15, 374/572; 429/121, DIG. 9
See application file for complete search history.

(56) References Cited

U.S. PATENT DOCUMENTS

| | | | | |
|---|---|---|---|---|
| 3,609,505 | A * | 9/1971 | Harland et al. | 320/123 |
| 4,833,390 | A * | 5/1989 | Kumada et al. | 320/150 |
| 5,197,889 | A * | 3/1993 | Rizzo et al. | 439/76.1 |
| 5,619,417 | A * | 4/1997 | Kendall | 702/63 |
| 6,522,104 | B1 * | 2/2003 | Drori | 320/149 |
| 6,861,821 | B2 * | 3/2005 | Masumoto et al. | 320/107 |
| 7,021,823 | B2 * | 4/2006 | Roepke et al. | 374/152 |
| 7,059,769 | B1 * | 6/2006 | Potega | 374/185 |
| 7,439,954 | B2 * | 10/2008 | Theytaz et al. | 345/166 |
| 7,465,088 | B2 * | 12/2008 | Garcia et al. | 374/153 |
| 7,479,116 | B2 * | 1/2009 | Yarden et al. | 600/549 |

(Continued)

FOREIGN PATENT DOCUMENTS

CN      88 2 01043 U       11/1988

(Continued)

OTHER PUBLICATIONS

German Office Action for Application No. 10 2008 006 542.0-45, issued Nov. 4, 2009.

(Continued)

Primary Examiner—Gail Verbitsky
(74) Attorney, Agent, or Firm—Oliff & Berridge, PLC

(57) ABSTRACT

A battery condition detection apparatus is composed of a semiconductor element, and a lead frame and mold resin. The semiconductor element is composed of plural diodes connected in series as a temperature sensitive element for detecting a temperature of a battery and a communication circuit for outputting a temperature detection result to an outside device such as ECU mounted on a vehicle. The semiconductor element is mounted on the lead frame having high heat conductivity rather than that of the mold resin. The semiconductor element and the lead frame are completely sealed with the mold resin. The battery condition detection apparatus is mounted on a battery case which accommodates the battery of a vehicle so that the lead frame of high heat conductivity is directly contacted to the battery case. The heat conductivity of the lead frame is more than 100 times of that of the mold resin.

6 Claims, 5 Drawing Sheets

U.S. PATENT DOCUMENTS

| | | | |
|---|---|---|---|
| 7,541,781 B2 * | 6/2009 | Gamboa | 320/152 |
| 7,679,357 B2 * | 3/2010 | Aratani et al. | 324/117 H |
| 2003/0162084 A1 | 8/2003 | Shigeta et al. | |

FOREIGN PATENT DOCUMENTS

| | | | |
|---|---|---|---|
| CN | 1435909 A | | 8/2003 |
| DE | 93 07 800.5 | | 9/1993 |
| JP | 61190966 A | * | 8/1986 |
| JP | A-8-205419 | | 8/1996 |
| JP | 11031764 A | * | 2/1999 |
| JP | A 2003-185504 | | 7/2003 |
| JP | A 2005-146939 | | 6/2005 |
| JP | A-2006-133028 | | 5/2006 |

OTHER PUBLICATIONS

Chinese Office Action for Application No. 2008-10006269.5, issued Sep. 18, 2009. (w/ English-language Translation).

Japanese Office Action for Application No. 2007-028949, Issued May 12, 2009.

* cited by examiner

BATTERY CONDITION DETECTION APPARATUS

CROSS-REFERENCE TO RELATED APPLICATION

This application is related to and claims priority from Japanese Patent Application No. 2007-28949 filed on Feb. 8, 2007, the contents of which are hereby incorporated by reference.

BACKGROUND OF THE INVENTION

1. Field of the Invention

The present invention relates to a battery condition detection apparatus capable of detecting a battery condition such as a temperature of a battery mounted on passenger vehicles and trucks.

2. Description of the Related Art

A method of detecting the temperature of a battery mounted on a vehicle using a thermistor has been known. For example, Japanese patent laid open publications No. JP 2003-185504, and No. JP 2005-146939 have disclosed such a method using a thermistor.

To detect a temperature of a battery mounted on a vehicle can avoid an accident such as occurrences of an abnormal state and a reduction of a life-time of the battery, and further estimate the engine starting condition under an ambient atmosphere of the vehicle when its temperature rapidly drops.

A temperature sensitive element such as a thermistor capable of detecting the temperature of the battery is electrically connected to an output lines or wirings. The connection part between the thermistor and the output wirings has a low reliability in electrical connection. For example, such thermistor and output wirings are electrically connected at the connection part with soldering, the reliability of the connection part is further decreased under a high temperature environment, for example, when it is disposed in an engine room of the vehicle. Further, when the temperature of the battery is detected based on a voltage of analogue data detected by the thermistor, there is a possibility of getting ignition noises and the like on the output wiring, in particular, in the engine room, and the detection accuracy is thereby decreased.

In case that the temperature sensitive element such as a thermistor is exposed outside, the cooling capability of the temperature sensitive element is varied according to air-flow blowing condition. For example, the cooling capability of the temperature sensitive element is greatly varied by external factors when the vehicle is stopped or the vehicle travels at a high speed. The accuracy of detecting the temperature of the battery mounted on the vehicle is decreased because the detection accuracy greatly varies by such external factors.

SUMMARY OF THE INVENTION

It is an object of the present invention to provide a battery condition detection apparatus capable of detecting a temperature of a battery with improved high reliability while preventing a decrease of its detection accuracy.

To achieve the above purposes, the present invention provides a battery condition detection apparatus capable of detecting a temperature of a battery, for example, mounted on a vehicle. The battery condition detection apparatus has a semiconductor element, a primary member of a first heat conductivity (as a high heat conductivity), and a secondary member of a second heat conductivity (as a low heat conductivity). The semiconductor element accommodates a temperature sensitive element capable of detecting a temperature of the battery and a serial communication circuit for outputting a temperature detection result to an outside device (such as an ECU) through a serial communication line. The semiconductor element is mounted on the primary member of the first heat conductivity. The secondary member is lower in heat conductivity than the primary member. The semiconductor element and the primary member are sealed with the secondary member.

According to the present invention, because the wiring for the temperature sensitive element is formed in the semiconductor element, it is possible to increase the reliability of the connection part of the temperature sensitive element through which the temperature detection signal as the detection results is output to the outside device such as ECU mounted on a vehicle, for example. Further, because the temperature detection signal is converted to serial data items and then transferred to the outside device through the serial communication line, it is possible to easily escape from the influence of getting noises and thereby to increase the temperature detection accuracy when compared with the case of outputting the temperature detection signal (such as a voltage value) of analogue data. Still further, because the temperature sensitive element is sealed with the secondary member of the second heat conductivity (as a low heat conductivity), it is possible to escape from the influence of varying the cooling capability according to the air flow condition under the vehicle traveling state. Further, it is possible to increase the temperature detection accuracy because of having less variation of the temperature detection condition.

In the battery condition detection apparatus as another aspect of the present invention, the primary member is a lead frame, and the secondary member is made of mold resin with which the lead frame and the semiconductor element are sealed in one assembled body. Because the lead frame as the primary member and the semiconductor element are sealed with mold resin in one assembled body, it is possible to increase the bridge density between the mold resin and the semiconductor element. Although sealing resin such as epoxy resin as silicon gel is used as the secondary member, it is preferable to use the mold resin. This configuration can also increase the reliability of the battery condition detection apparatus from pouring a battery liquid over itself.

In the battery condition detection apparatus as another aspect of the present invention, a surface of the primary member is exposed to the outside of the secondary member. The exposed surface of the primary member of the first heat conductivity (as a high heat conductivity) in the battery condition detection apparatus is directly contacted to a battery case which accommodates the battery mounted on a vehicle. This configuration enables that the heat energy of the battery is easily conducted to the temperature sensitive element in the semiconductor element through the primary member. It is thereby possible to further increase the temperature detection accuracy by enhancing the thermal correlation between the battery and the battery condition detection apparatus.

In the battery condition detection apparatus as another aspect of the present invention, a thickness t2 of the secondary member on the semiconductor element side placed on the primary member and a thickness t1 of the secondary member under the semiconductor element satisfies the relationship of t2>t1. Because the thickness thin part t1 of the secondary member is contacted to the battery case which accommodates the battery, it is possible to easily conduct the thermal energy of the battery to the temperature sensitive element. This can increase the reliability of the battery condition detection apparatus from pouring a battery liquid over itself.

In the battery condition detection apparatus as another aspect of the present invention, a surface of the primary member under the semiconductor element is mounted on a battery case which accommodates the battery when detecting a temperature of the battery. This configuration enables that the heat energy of the battery is easily conducted to the temperature sensitive element through the primary member in the battery condition detection apparatus. It is thereby possible to increase the temperature detection accuracy of the battery condition detection apparatus by enhancing the thermal correlation between the battery and the battery condition detection apparatus.

In the battery condition detection apparatus as another aspect of the present invention, the battery condition detection apparatus is so mounted on a battery case which accommodates the battery that the secondary member is exposed to a position where air is blowing when a temperature of the battery is detected and the vehicle travels. This configuration can escape from the influence of varying the cooling capability according to the air flow condition caused by the vehicle running state. Further, this configuration can increase the temperature detection accuracy because of decreasing the variation of the temperature detection.

In the battery condition detection apparatus as another aspect of the present invention, the first heat conductivity of the primary member is more than 100 times of the second heat conductivity of the secondary member. This configuration can increase the heat conductivity between the battery and the battery condition detection apparatus, and it is thereby possible to increase the temperature detection accuracy of the battery condition detection apparatus by enhancing the thermal correlation between the battery and the battery condition detection apparatus.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
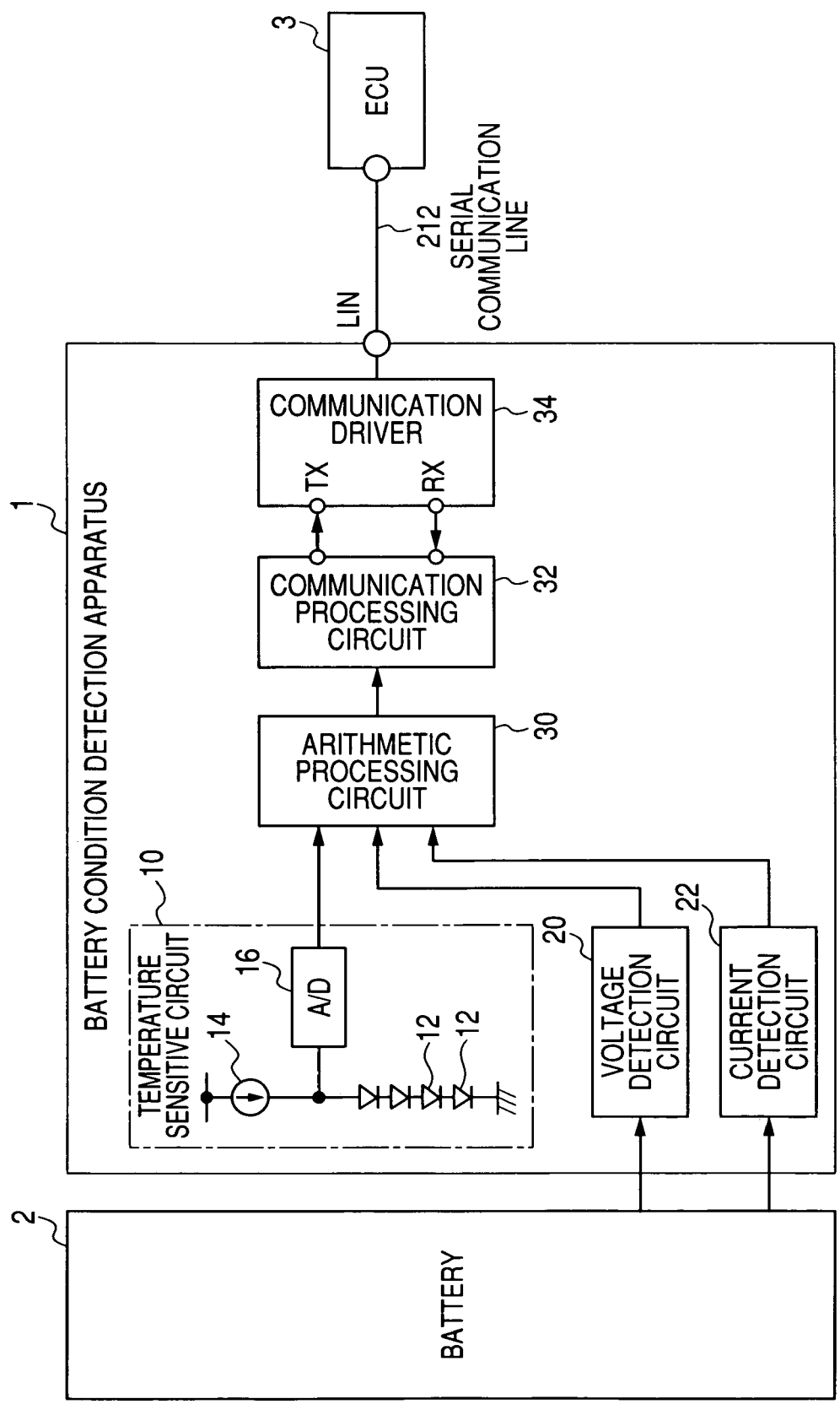
FIG. 1 shows an entire configuration of a battery condition detection apparatus according to an embodiment of the present invention which is mounted on a battery and connected to an ECU mounted on a vehicle through a serial communication line.

Hereinafter, various embodiments of the present invention will be described with reference to the accompanying drawings. In the following description of the various embodiments, like reference characters or numerals designate like or equivalent component parts throughout the several diagrams.

Embodiment

A description will be given of the battery condition detection apparatus of an embodiment and its modifications according to the present invention with reference to FIG. 1 to FIG. 8.

FIG. 1 shows an entire configuration of the battery condition detection apparatus 1 according to the embodiment of the present invention, a battery 2 as a target in detection, and an ECU 3 (electric control unit) mounted on a vehicle (not shown). The battery condition detection apparatus 1 detects various conditions such as a temperature, a terminal voltage, and a charging/discharging current of the battery 2, and then generates and outputs detection signals as detection results to the ECU 3 through a serial communication line 212. The ECU 3 is mounted on the vehicle and as external control device observed from the battery condition detection apparatus 1. The battery condition detection apparatus 1 is composed mainly of a temperature sensitive circuit 10, a voltage detection circuit 20, a current detection circuit 22, an arithmetic processing circuit 30, a communication processing circuit 32, and a communication driver 34.

The temperature sensitive circuit 10 only detects the temperature of the battery 2. The temperature sensitive circuit 10 is comprised of a plurality of diodes 12 (for example, four diodes) connected in series as the temperature sensitive element, and analogue to digital converter (A/D converter) 16 capable of converting a forward voltage of the plural diodes 12 to digital data items. The battery condition detection apparatus 1 of the embodiment detects the temperature of the battery 2, generates and outputs the digital data regarding a correlation value of the detected temperature of the battery 2 based on the characteristic of changing the forward voltage in the diodes 12 connected in series is changed according to the magnitude of temperature of the battery 2.

The voltage detection circuit 20 detects the terminal voltage of the battery 2. For example, the voltage detection circuit 20 is comprised of a voltage dividing circuit capable of dividing the terminal voltage of the battery 2 and an analogue to digital converter (A/D converter) capable of converting the divided voltage to digital data items. The voltage detection circuit 20 outputs the data corresponding to the terminal voltage of the battery 2.

The current detection circuit 22 detects the charging/discharging current which is input to/output from the battery 2. For example, the current detection circuit 22 is comprised of a current detection resistance connected to a charging wiring connected to the battery terminal and an analogue to digital converter (A/D converter) capable of converting the voltage between both ends of the resistance to a digital data item. The current detection circuit 22 outputs the data corresponding to the charging/discharging current of the battery 2.

The arithmetic processing circuit 30 calculates the temperature, the terminal voltage and the charging/discharging current of the battery 2 based on the output data items transferred from the temperature sensitive circuit 10, the voltage detection circuit 20, and the current detection circuit 22. The arithmetic processing circuit 30 calculates SOC (state of charge) of the battery 2 at the detection time based on the calculation results. The arithmetic processing circuit 30 then outputs those data items regarding the temperature, the terminal voltage, the charging/discharging current, and the SOC of the battery 2.

The communication processing circuit 32 receives the data items transferred from the arithmetic processing circuit 30, and modulates the received data items, and writes modulated data items into a signal having a predetermined data format for use in a serial communication. That is, the communication processing circuit 32 performs the modulation process for converting the received data items into the signal having the predetermined data format. The communication processing circuit 32 then transfers the signal having the predetermined data format to the ECU 3 through the communication line through the communication driver 34.

Figure 2:
FIG. 2 shows a data format of a signal transferred from the battery condition detection apparatus to the ECU through the serial communication line based on LIN protocol.

FIG. 2 shows the signal having such a predetermined data format transferred from the battery condition detection apparatus 1 to the ECU 3 through the serial communication line 212 (see FIG. 1) based on LIN protocol. As shown in FIG. 2, the battery condition detection apparatus 1 transfers the signal having the predetermined data format which is composed of a synchronous field, an identification (ID) field, a voltage (as the terminal voltage) field, a current (as the charging/discharging current) field, a temperature (as the temperature of the battery 2) field, a SOC (State of charge of the battery 2) field, and a check sum field.

Figure 3:
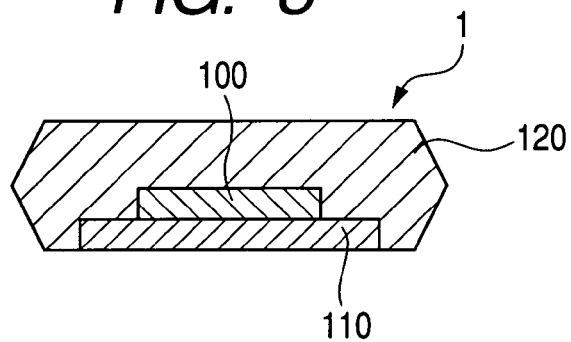
FIG. 3 is a cross section of the battery condition detection apparatus according to the embodiment of the present invention.

FIG. 3 is a cross section of a structure of the battery condition detection apparatus 1 according to the embodiment of the present invention. As shown in FIG. 3, the battery condition detection apparatus 1 is composed of a semiconductor element 100, a primary member 110 of a first heat conductivity on which the semiconductor element 100 is mounted, and a secondary member 120 of a second heat conductivity with which the semiconductor element 100 and the primary element 110 is sealed. The first heat conductivity of the primary member 110 is higher than the second heat conductivity of the secondary member 120. The semiconductor element 100 is composed of the temperature sensitive circuit 10, the voltage detection circuit 20, the current detection circuit 22, the arithmetic processing circuit 30, the communication processing circuit 32, and the communication driver 34. The heat conductivity of the primary member 110 is a high value, for example, more than ten times, preferably more than 100 times, than that of the secondary member 120.

Because this configuration of the battery condition detection apparatus 1 enables the wiring for various elements such as the diodes 12 to be performed on the semiconductor element 100, it is possible to enhance the reliability of the output connection parts of the diodes 12. Still further, the battery condition detection apparatus 1, having the configuration of the semiconductor element 100 to output the temperature detection result obtained by using the diodes 12 to the ECU 3 through the serial communication, can easily escape from the influence of getting noises and can increase the temperature detection accuracy when compared with the case of outputting the voltage detection result of analogue date which is obtained using the diodes 12. Moreover, because the semiconductor element 100 is sealed with the secondary member 120 of a low heat conductivity, it is possible to suppress the influence of varying the cooling capability caused by the air flow condition which varies according to the driving condition of the vehicle.

In a concrete example of the battery condition detection apparatus 1, the primary member 110 is a lead frame and the secondary member 120 is mold resin. Both the lead frame as the primary member 110 and the semiconductor element 100 are sealed with the mold resin as the secondary member 120. Sealing the semiconductor element 100 and the lead frame as the primary member 110 with the mold resin can increase a bridge density between the mold resin and the semiconductor element 100 when compared with a case of using silicon gel such as epoxy resin. This can increase the reliability of the battery condition detection apparatus 1 from pouring a battery liquid over itself.

Furthermore, in the configuration of the battery condition detection apparatus 1 shown in FIG. 3, a part of the lead frame as the primary member 110 sealed with the secondary member 120 is exposed outside. Because the exposed part of the lead frame as the primary member 110 is directly mounted on and contacted to the battery 2 (namely, a battery case 300 accommodating the battery 2 (see FIG. 7 explained later), it is possible to enhance the thermal conductivity between the diodes 12 in the semiconductor element 100 and the battery 2 through the primary member 110 and thereby possible to increase the temperature detection accuracy of the battery condition detection apparatus 1. Preferred examples of mounting the battery condition detection apparatus 1 on the battery case 300 accommodating the battery 2 will be explained later.

Figure 4:
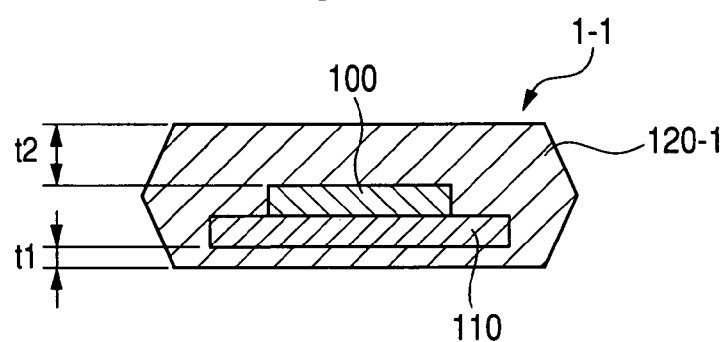
FIG. 4 is a cross section of another configuration of the battery condition detection apparatus according to the embodiment of the present invention.

FIG. 4 is a cross section of another configuration of the battery condition detection apparatus 1-1 according to the embodiment of the present invention. When compared with the configuration of the battery condition detection apparatus 1 shown in FIG. 3, the battery condition detection apparatus 1-1 shown in FIG. 4 has another configuration in which the entire of the semiconductor element 100 and the primary member 110 is completely sealed with the secondary member 120-1.

As shown in FIG. 4, the secondary member 120-1 has another configuration in which the thickness t1 of the secondary member 120-1 under the primary member 110 is thinner than the thickness t2 of the secondary member 120-1 at the semiconductor element 100 side mounted on the primary member 110.

As shown in FIG. 4, because the thinner part having the thickness t1 of the secondary member 120-1 under the primary member 110 side is directly mounted on and contacted to the surface of the battery case 300 accommodating the battery 2 (see FIG. 6 and FIG. 7), it is possible to increase the reliability of the primary member 110 from pouring a battery liquid over itself while keeping the easy conductivity of the heat energy between the battery 2 and the diodes 12 in the semiconductor element 100.

Figure 5:
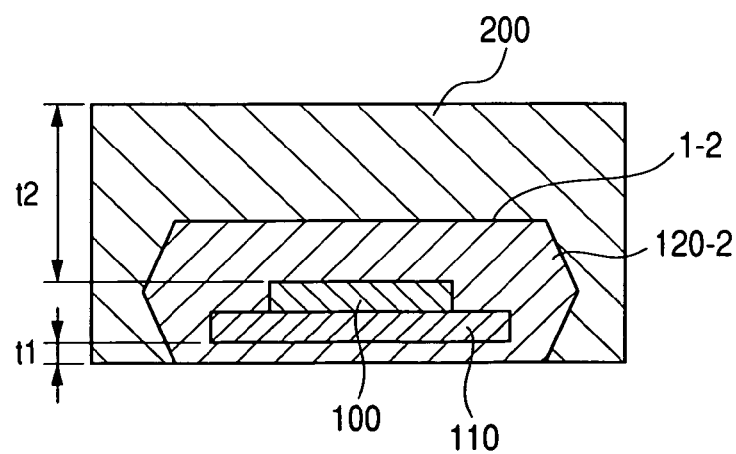
FIG. 5 is a cross section of the battery condition detection apparatus according to the embodiment of the present invention which is accommodated in a connector case.

FIG. 5 is a cross section of the battery condition detection apparatus 1-2 covered with a connector case 200 according to the embodiment of the present invention. As shown in FIG. 5, the battery condition detection apparatus 1-2 is accommodated in the connector case 200 without gap and a part of the battery condition detection apparatus 1-2 is exposed outside, namely, directly contacted to the battery case 300 accommodating the battery 2 (see FIG. 6 and FIG. 7). This configuration enables that the heat energy of the battery 2 is easily conducted to the battery condition detection apparatus 1-2. In the configuration where the secondary member 120-2 is covered with the connector case 200 without gap, it is possible to consider the total thickness of the secondary member 120-2 and the connector case 200 as the secondary member. In the configuration shown in FIG. 5, the battery condition detection apparatus 1-2 is directly contacted to the battery 2 (namely, to the battery case 300 accommodating the battery 2). The present invention is not limited by this configuration, for example, it is possible to combine the battery condition detection apparatus 1 shown in FIG. 3 with the connector case 200.

Figure 6:
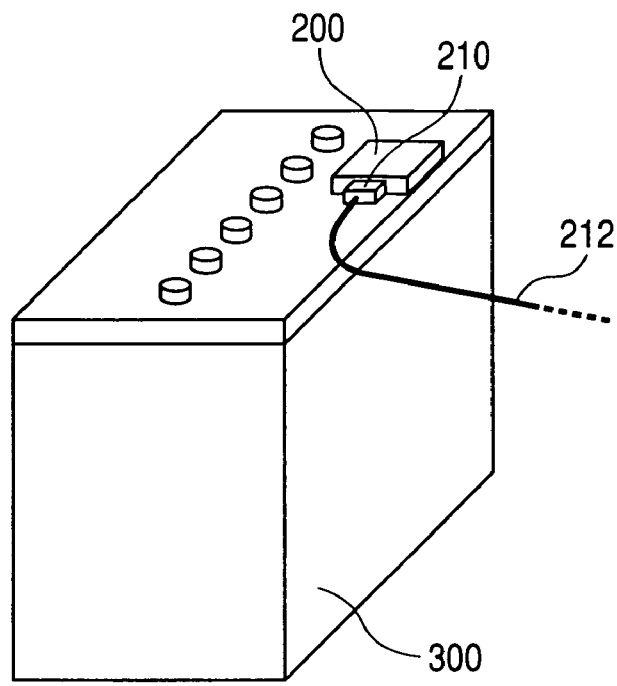
FIG. 6 is a perspective view of the connector case accommodating the battery condition detection apparatus mounted on the top of a battery case accommodating the battery.

FIG. 6 is a perspective view of the connector case 200 accommodating the battery condition detection apparatus 1 mounted on the top of the battery case 300 which accommodates the battery 2. As shown in FIG. 6, the connector case 200 which accommodates the battery condition detection apparatus 1 is directly mounted on the top of the battery case 300 which accommodates the battery 2. The cross-sectional configuration of the connector case 200 is shown in FIG. 5.

As shown in FIG. 6, a connector 210 is jointed to the connector case 200, and the serial communication line 212 is connected to the ECU 3 (omitted from FIG. 6).

Figure 7:
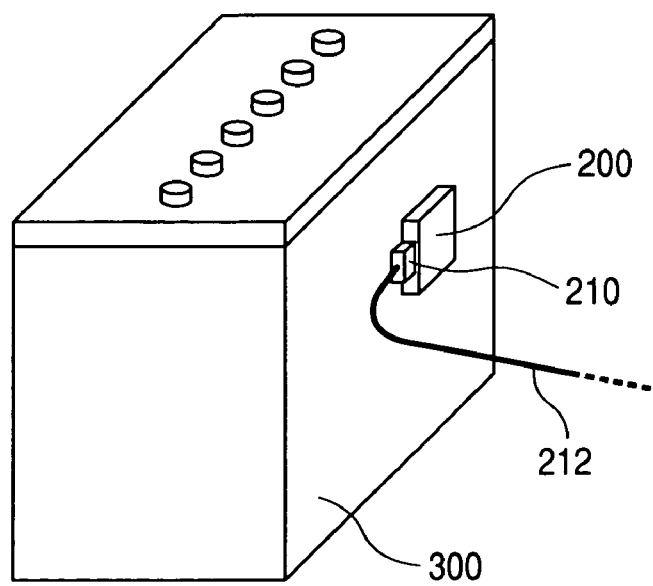
FIG. 7 is a perspective view of the connector case accommodating the battery condition detection apparatus mounted on a side surface of the battery case accommodating the battery.

FIG. 7 is a perspective view of the connector case 200 accommodating the battery condition detection apparatus 1 mounted on a side surface of the battery case 300 accommodating the battery 2. As shown in FIG. 7, the connector case 200 accommodating the battery condition detection apparatus 1 is attached onto the side surface of the battery case 300.

In both the configurations shown in FIG. 6 and FIG. 7, the connector case 200 is blowing in the air flow when the vehicle travels. However, because only the secondary member (for example, the combination of the secondary member and the connector case is considered as the secondary member as described above) is exposed to the air flow, it is possible to escape the influence of air flow to the diodes 12 formed in the semiconductor element 100 in the battery condition detection apparatus 1 and thereby to prevent the variation of the detection temperature of the battery condition detection apparatus 1 even if the vehicle travels at high speed. This can increase the detection accuracy of the temperature of the battery 2.

Figure 8:
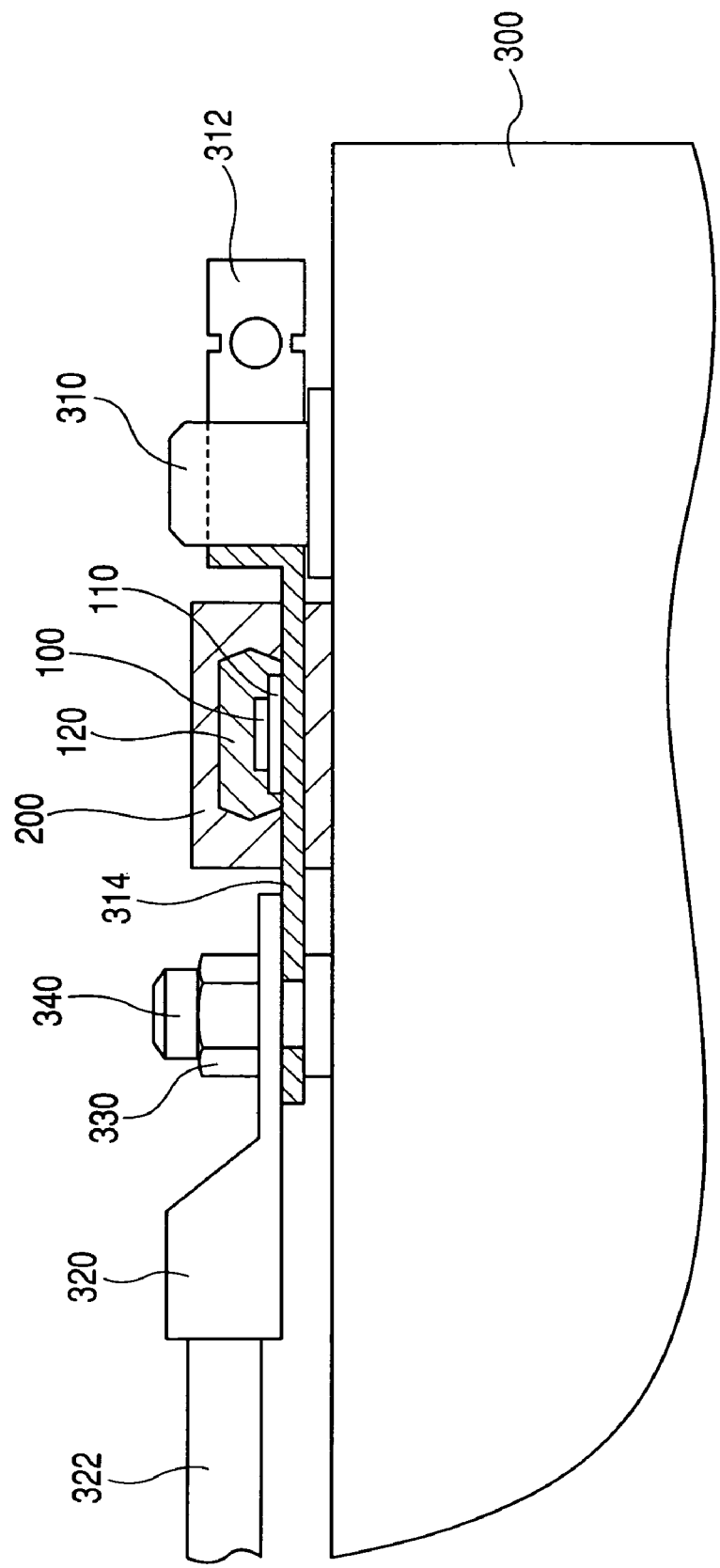
FIG. 8 is a perspective view of the connector case accommodating the battery condition detection apparatus mounted on another part of the battery case accommodating the battery.

FIG. 8 is a perspective view of the connector case 200 accommodating the battery condition detection apparatus 1 mounted on another part of the battery case 300 which accommodates the battery 2.

As shown in FIG. 8, connector case 200 accommodating the battery condition detection apparatus 1 is mounted on the battery case 300 using or through a terminal lead 312. In general, battery terminals 310 are mounted on a part of the battery case 300, and a terminal lead 312 is connected to the battery terminals 310. A wire harness terminal 320 is fastened to the terminal lead 312 by a bolt 340 and a nut 330. A harness 322 is connected to the harness terminal 320. The harness 322 acts as a charging wiring. In the configuration shown in FIG. 8, the connector case 200 accommodating the battery condition detection apparatus 1 is attached to a terminal lead member 314 of a plate shape which is a part of the terminal lead 312. This enables the terminal lead 312 to be connected to the battery terminal 310 and at the same time, the connector case 200 to be contacted and fixed to the battery case 300 without using any adhesion.

The concept of the present invention is not limited by the configurations described above. It is possible to apply the present invention to various applications. For example, although the above description explains the secondary member 120 made of mold resin, it is possible to use a silicon gel or a coating material instead of such mold resin. It is possible to use one of Cu, Al, Fe, ceramics substrate and the like as the primary member 100. Further, although the four diodes connected in series are used as the temperature sensitivity element in the battery condition detection apparatus 1, it is possible to change the number of the diodes 12 or to use the temperature sensitive element other than the diodes.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalent thereof.

What is claimed is:

1. A battery condition detection apparatus capable of detecting a temperature of a battery, comprising:
    a semiconductor element which accommodates a temperature sensitive element for detecting a temperature of the battery and a serial communication circuit outputting a temperature detection result to an outside device through a serial communication;
    a primary member of a first heat conductivity on which the semiconductor element is mounted; and
    a secondary member of a second heat conductivity which is lower than the first heat conductivity of the primary member, with which the semiconductor element and the primary member are sealed,
    wherein the primary member is a lead frame, and the secondary member is made of mold resin with which the lead frame and the semiconductor element are sealed in one assembled body.

2. The battery condition detection apparatus according to claim 1, wherein a surface of the primary member is exposed to the outside of the secondary member.

3. The battery condition detection apparatus according to claim 1, wherein a thickness t2 of the secondary member on the semiconductor element side placed on the primary member and a thickness t1 of the secondary member under the semiconductor element satisfies the relationship of t2>t1.

4. The battery condition detection apparatus according to claim 1, wherein a surface of the primary member under the semiconductor element is mounted on a battery case which accommodates the battery when detecting a temperature of the battery.

5. The battery condition detection apparatus according to claim 1, wherein the battery condition detection apparatus is mounted to a battery case which accommodates the battery so that the secondary member is exposed to a position through which air is introduced when a vehicle travels.

6. The battery condition detection apparatus according to claim 1, wherein the first heat conductivity of the primary member is more than 100 times of the second heat conductivity of the secondary member.

* * * * *